(12) United States Patent
Tang et al.

(10) Patent No.: US 7,986,549 B1
(45) Date of Patent: Jul. 26, 2011

(54) APPARATUS AND METHOD FOR REFRESHING OR TOGGLING A PHASE-CHANGE MEMORY CELL

(75) Inventors: Stephen Tang, Fremont, CA (US); DerChang Kau, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 262 days.

(21) Appl. No.: 12/345,462

(22) Filed: Dec. 29, 2008

(51) Int. Cl.
*G11C 11/00* (2006.01)
(52) U.S. Cl. ............... 365/163; 365/222; 365/189.09; 365/185.21
(58) Field of Classification Search ............... 365/163, 365/222, 189.09, 185.21, 185.19
See application file for complete search history.

(56) References Cited

U.S. PATENT DOCUMENTS

| | | | |
|---|---|---|---|
| 7,030,640 B2 * | 4/2006 | Yee et al. ................ | 324/765 |
| 7,593,255 B2 * | 9/2009 | Happ et al. .............. | 365/163 |
| 7,729,163 B2 * | 6/2010 | Ramani et al. .......... | 365/163 |
| 7,791,935 B2 * | 9/2010 | Kang et al. .............. | 365/163 |
| 7,796,424 B2 * | 9/2010 | Happ et al. .............. | 365/163 |

OTHER PUBLICATIONS

Ielmini, Daniele, et al. "Recovery and Drift Dynamics of Resistance and Threshold Voltages in Phase-Change Memories," IEEE Transactions on Electron Devices, vol. 54, No. 2, Feb. 2007, pp. 308-315.
Lai, Stefan "Current status of the phase change memory and its future," IEEE, Electron Devices Meeting, 2003, pp. 255-258.

* cited by examiner

*Primary Examiner* — David Lam
(74) *Attorney, Agent, or Firm* — Blakely, Sokoloff, Taylor & Zafman LLP (57) ABSTRACT

An apparatus and a method for refreshing or toggling a phase-change memory cell are described. The apparatus includes a voltage ramp element coupled to the phase-change memory cell and provided for controlling voltage across the phase-change memory cell. A current control element is coupled to the phase-change memory cell and provided for controlling current through the phase-change memory cell. A current sensor element is coupled to the phase-change memory cell. A write-back timer and control element is coupled to the current sensor element and to the current control element.

20 Claims, 5 Drawing Sheets

APPARATUS AND METHOD FOR REFRESHING OR TOGGLING A PHASE-CHANGE MEMORY CELL

TECHNICAL FIELD

Embodiments of the invention are in the field of phase-change memory cells and, in particular, apparatuses and methods for refreshing or toggling phase-change memory cells.

BACKGROUND

Embedded SRAM and DRAM have problems with non-volatility and soft error rates, while embedded FLASH memories require additional masking layers or processing steps during manufacture, require high-voltage for programming, and have issues with endurance and reliability. Phase-Change Memory (PCM) overcomes the criticality of the above mentioned parameters and exhibits favorable write speeds, small cell sizes, simpler circuitries and a fabrication compatibility with the Complementary Metal-Oxide-Semiconductor (CMOS) process. However, additional improvements are needed in the evolution of the PCM technology.

DETAILED DESCRIPTION

An apparatus and a method for refreshing or toggling a phase-change memory cell are described herein. In the following description, numerous specific details are set forth, such as specific dimensions, in order to provide a thorough understanding of embodiments of the present invention. It will be apparent to one skilled in the art that embodiments of the present invention may be practiced without these specific details. In other instances, well-known processing operations, such as material processing operations, are not described in detail in order to not unnecessarily obscure embodiments of the present invention. Furthermore, it is to be understood that the various embodiments shown in the Figures are illustrative representations and are not necessarily drawn to scale.

Disclosed herein are an apparatus and a method for refreshing or toggling a phase-change memory cell. The apparatus may include a voltage ramp element coupled to a phase-change memory cell and provided for controlling voltage across the phase-change memory cell. In an embodiment, a current control element is coupled to the phase-change memory cell and provided for controlling current through the phase-change memory cell. A current sensor element is coupled to the phase-change memory cell. A write-back timer and control element is coupled to the current sensor element and to the current control element. A method for refreshing a phase-change memory cell may include determining if the phase-change memory cell is in a set state or a reset state. In an embodiment, a current pulse is then delivered to the phase-change memory cell either to maintain or to restore the set state or the reset state. A method for toggling a phase-change memory cell may include determining if the phase-change memory cell is in a set state or a reset state. In an embodiment, a current pulse is then delivered to the phase-change memory cell to toggle the set state or the reset state.

Figure 1:
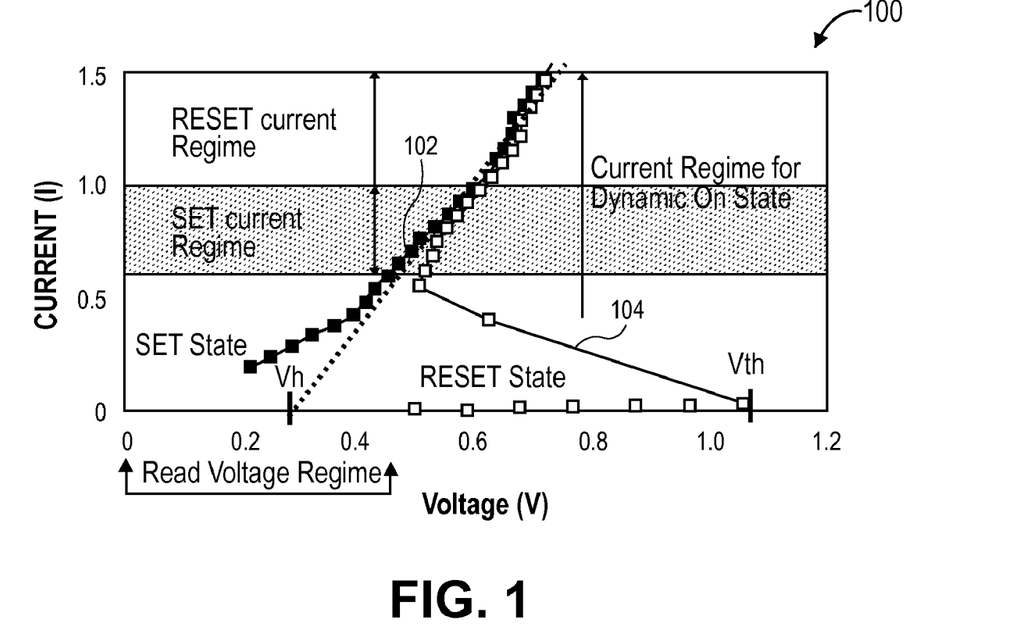
FIG. 1 depicts a plot including current-voltage (IV) curves of a phase-change memory cell, in accordance with an embodiment of the present invention.

Phase-change memory may store information based on the material state of the memory film, e.g. a chalcogenide-based memory film. For example, the current-voltage (IV) characteristics of a phase-change memory cell may differ between the amorphous and crystalline states. FIG. 1 depicts a plot 100 including IV curves of a phase-change memory cell, in accordance with an embodiment of the present invention. Referring to FIG. 1, a SET (crystalline) cell curve 102 exhibits conduction at a current of approximately 0.5 normalized Amps at approximately 0.4 normalized Volts, whereas a RESET (amorphous) cell curve 104 does not exhibit conduction until the normalized voltage is above the threshold voltage (Vth), e.g., at approximately 1.1 normalized Volts. In an embodiment, upon conduction by the RESET cell, the IV curve 104 snaps back, as shown in FIG. 1. Thus, in one embodiment, an applied voltage of approximately 0.4 normalized Volts is used to sense low-field resistance.

The low-field resistance of the phase-change memory cell may be measured to determine the state of the bit, with an amorphous cell being approximately in the range of 10 to 1000 times more resistive than a crystalline cell. In an embodiment, the threshold voltage (Vth) tracks resistance and is also used as a means to differentiate between amorphous and crystalline cell states. In one embodiment, Vth is used to determine the state of a phase-change memory cell to be read and refreshed. A read and refresh scheme may be performed in two separate operations, e.g., read and write-back. In one embodiment, in order to read the phase-change memory cell, a voltage ramp that linearly increases in time is applied across the phase-change memory cell. Depending on the time lag for current to flow through the phase-change memory cell during the ramp, the threshold voltage of the phase-change memory cell may be inferred. In an embodiment, the stopping point of the voltage ramp is set at a value high enough to guarantee that the phase-change memory cell with the highest expected threshold voltage will still threshold. Thus, in one embodiment, at the end of the read phase, the phase-change memory cell will be in its conductive "on-state," even for a higher resistance cell. In a specific embodiment, a current clamp is used in series with the phase-change memory cell such that an originally crystalline phase-change memory cell does not progress into the amorphizing current regime, as depicted in FIG. 1, when the voltage ramp nears the value of the amorphous threshold voltage.

As described above, phase-change memories, e.g. chalcogenide-material based memories, store information as the material state (either crystalline or amorphous). In accordance with an embodiment of the present invention, although phase-change memory is characterized as non-volatile, amorphous regions may increase in resistance and threshold voltage (through a process known as "drift"), or crystallize through solid-phase epitaxy. Both processes may change the state of a memory element such that a read will return an incorrect result. Additionally, in one embodiment, some phase-change memory materials have retention characteristics that make them unsuitable for non-volatile applications, but adequate for volatile applications as a dynamic random-access memory (DRAM) replacement. In a specific embodiment, a refresh operation is required for such materials. Thus, in accordance with an embodiment of the present invention, a method to read and restore the state of a phase-change memory cell is provided to eliminate drift or crystallization that has occurred after the phase-change memory cell was originally written. In an embodiment, the refresh is applied before the cell has changed (drifted or crystallized) to a point that a read returns an incorrect result.

Figure 2:
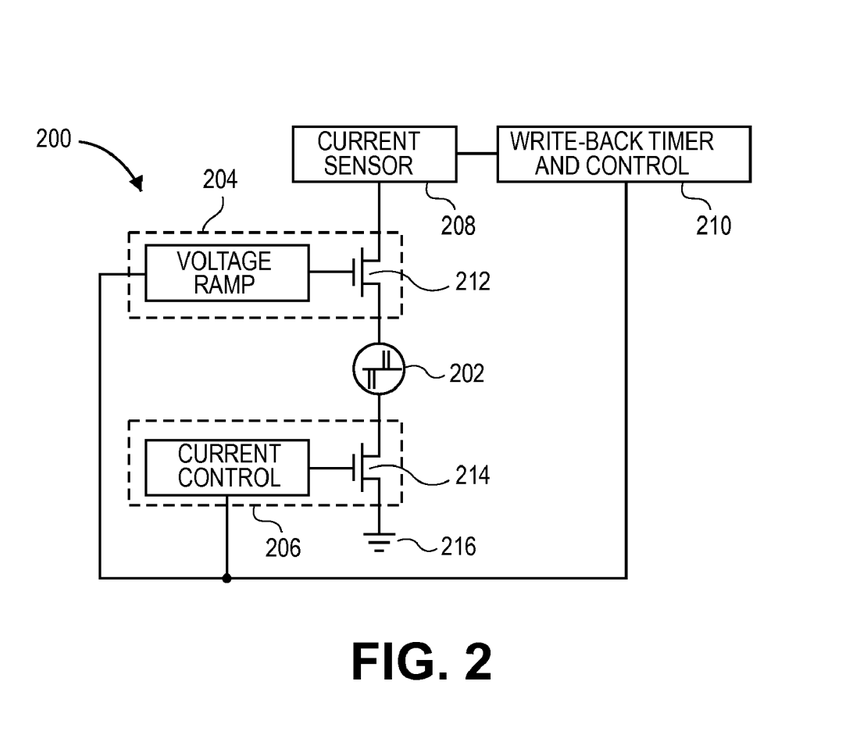
FIG. 2 illustrates a schematic representation of a circuit for refreshing or toggling a phase-change memory cell, in accordance with an embodiment of the present invention.

In an aspect of the present invention, a circuit is provided for refreshing or toggling a phase-change memory cell. FIG. 2 illustrates a schematic representation of a circuit for refreshing or toggling a phase-change memory cell, in accordance with an embodiment of the present invention.

Referring to FIG. 2, a circuit 200 includes a voltage ramp element 204 coupled to a phase-change memory cell 202. In one embodiment, voltage ramp element 204 is provided for controlling voltage across phase-change memory cell 202. A current control element 206 is coupled to phase-change memory cell 202. In one embodiment, current control element 206 is provided for controlling current through phase-change memory cell 202. A current sensor element 208 is coupled to phase-change memory cell 202. In one embodiment, current sensor element 208 includes a comparator circuit. A write-back timer and control element 210 is coupled to current sensor element 208, to current control element 206, and to voltage ramp element 204. In one embodiment, write-back timer and control element 210 is provided for correcting, based on an output from the current sensor element, a drift in phase-change memory cell 202. In another embodiment, write-back timer and control element 210 is provided for correcting for, based on an output from the current sensor element, a loss of retention or a degradation of data integrity in phase-change memory cell 202.

In accordance with an embodiment of the present invention, voltage ramp element 204 includes a first transistor 212, as depicted in FIG. 2. In one embodiment, current sensor element 208 is coupled to phase-change memory cell 202 by an output of first transistor 212, as is also depicted in FIG. 2. In an embodiment, current control element 206 is configured to maintain an approximately steady current flow through phase-change memory cell 202 while a gate voltage applied to first transistor 212 is ramped to gradually increase the gate voltage over a period of time. In one embodiment, current control element 206 includes a second transistor 214, as depicted in FIG. 2. In a specific embodiment, current control element 206 is coupled to phase-change memory cell 202 by an output of second transistor 214, as is also depicted in FIG. 2. In a particular embodiment, an input of second transistor is grounded, e.g. by ground 216.

In accordance with an embodiment of the present invention, a voltage ramp for a read operation is applied on the gate of first transistor 212 of voltage ramp element 204. In one embodiment, first transistor 212 is biased as a source follower, so a source of first transistor 212 ramps up as well. In an embodiment, current sensor element 208 detects the point at which the current through the phase-change memory cell 202 exceeds a prescribed value. In one embodiment, the value is normalized at 0.5 Amps, as depicted along the on the y-axis of plot 100 from FIG. 1. Subsequently, in an embodiment, current sensor element 208 outputs the result to write-back timer and control element 210. In accordance with an embodiment of the present invention, upon comparing the time that current sensor element 208 trips to the time along the voltage ramp, write-back timer and control element 210 determines the state to which phase-change memory cell 202 should be re-written and sets the gate of second transistor 214 with the corresponding value and timing to either re-amorphize or re-crystallize phase-change memory cell 202.

Thus, in accordance with an embodiment of the present invention, upon determining the threshold voltage based on the linear voltage ramp of the gate of first transistor 212, the state into which phase-change memory cell 202 should be written-back is known. In one embodiment, phase-change memory cell 202 is re-programmed by setting the amplitude and pulse width of the current that will be allowed through phase-change memory cell 202. For example, in one embodiment, a higher magnitude and fast pulse will amorphize phase-change memory cell 202, whereas a moderate magnitude, longer pulse will allow phase-change memory cell 202 to crystallize. In an embodiment, the amplitude is set by a single transistor configured as a current mirror and the width is set by timing circuitry. In one embodiment, because phase-change memory cell 202 is already in its conductive state at the end of the read operation, the write-back operation is initiated as soon as the circuitry that shapes the current pulse is available.

Figure 3:
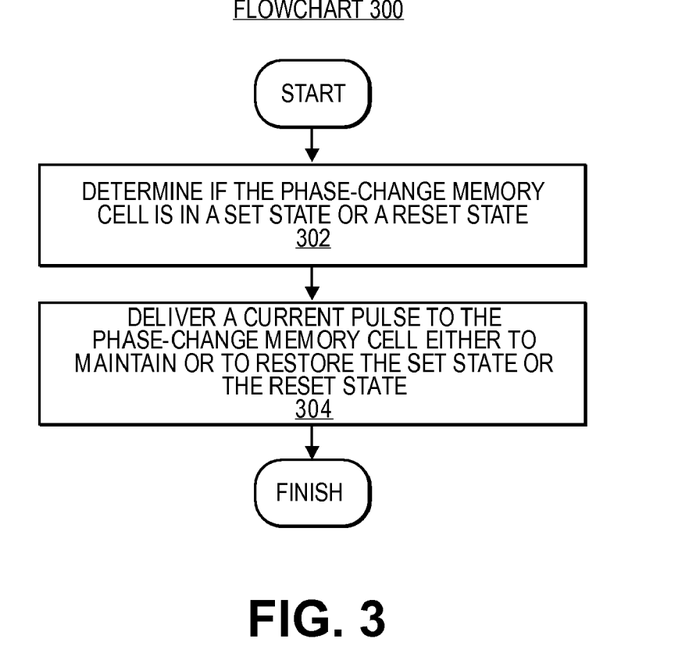
FIG. 3 illustrates a Flowchart representing operations in a method for refreshing a phase-change memory cell, in accordance with an embodiment of the present invention.

Accordingly, in an aspect of the present invention, a method for refreshing a phase-change memory cell is provided. FIG. 3 illustrates a Flowchart 300 representing operations in a method for refreshing a phase-change memory cell, in accordance with an embodiment of the present invention. Referring to operation 302 of Flowchart 300, a determination of whether the phase-change memory cell is in a set state or a reset state is made. Then, referring to operation 304 of Flowchart 300, a current pulse is delivered to the phase-change memory cell either to maintain or to restore the set state or the reset state. In one embodiment, determining whether the phase-change memory cell is in a set state or a reset state includes obtaining a flag from a current sensor coupled to the phase-change memory cell. In a specific embodiment, obtaining the flag includes determining the timing of a current flow through the phase-change memory cell. In one embodiment, the phase-change memory cell is coupled to a first transistor and a second transistor, and determining whether the phase-change memory cell is in a set state or a reset state includes preventing current flow through the phase-change memory cell from exceeding a limit set by the gate voltage of the second transistor while applying a gradually increasing gate voltage to the first transistor over a period of time. In an embodiment, if the current from the phase-change memory cell is lower than the prescribed limit, then current will flow. If the current from the phase-change memory cell exceeds the limit, the second transistor will absorb enough voltage so that the phase-change memory cell no longer exceeds the limit.

This keeps the phase-change memory cell in the on-state, but prevents excessive current from flowing until it has been determined into which state the bit should be written-back. In a specific embodiment, preventing current flow through the phase-change memory cell from exceeding the limit set by the gate voltage of the second transistor includes applying a fixed gate voltage to the second transistor. In a particular embodiment, an input of the second transistor is grounded. In an embodiment, restoring the set state or the reset state includes, immediately following the determining, changing the gate voltage applied to the second transistor. In one embodiment, maintaining or restoring the set state or the reset state includes correcting a drift in the phase-change memory cell. In another embodiment, maintaining or restoring the set state or the reset state includes correcting for a loss of retention or a degradation of data integrity in the phase-change memory cell.

Figure 4:
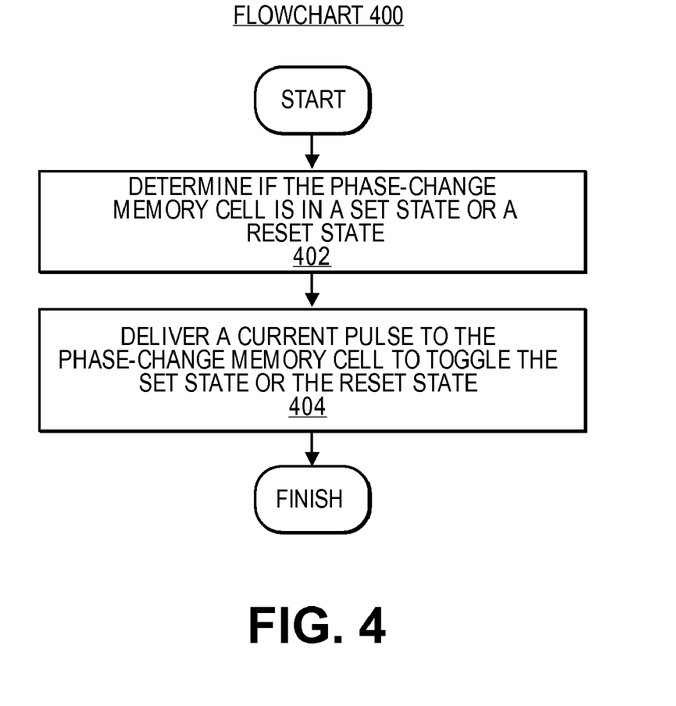
FIG. 4 illustrates a Flowchart representing operations in a method for toggling a phase-change memory cell, in accordance with an embodiment of the present invention.

In another aspect of the present invention, a method for cycling or toggling a phase-change memory cell is provided. FIG. 4 illustrates a Flowchart 400 representing operations in a method for cycling or toggling a phase-change memory cell, in accordance with an embodiment of the present invention. Referring to operation 402 of Flowchart 400, a determination of whether the phase-change memory cell is in a set state or a reset state is made. Then, referring to operation 404 of Flowchart 400, a current pulse is delivered to the phase-change memory cell to toggle the set state or the reset state. In one embodiment, determining whether the phase-change memory cell is in a set state or a reset state includes obtaining a flag from a current sensor coupled to the phase-change memory cell. In a specific embodiment, obtaining the flag includes determining the timing of a current flow through the phase-change memory cell. In one embodiment, the phase-change memory cell is coupled to a first transistor, and determining whether the phase-change memory cell is in a set state or a reset state includes preventing current flow through the phase-change memory cell from exceeding a limit set by the gate voltage of a second transistor while applying a gradually increasing gate voltage to the first transistor over a period of time. In a specific embodiment, preventing current flow through the phase-change memory cell from exceeding the limit set by the gate voltage of the second transistor includes applying a fixed gate voltage to a second transistor. In a particular embodiment, an input of the second transistor is grounded. In an embodiment, toggling the set state or the reset state includes, immediately following the determining, changing the gate voltage applied to the second transistor. In an embodiment, the method of cycling the phase-change memory cell further includes repeating the toggling of the set state or the reset state to stress-test the phase-change memory cell. Thus, in an embodiment, a circuit for refreshing or toggling a phase-change memory cell is included as an on-chip, built-in self-cycling stress-test to check reliability. In one embodiment, if a write-back element of the circuit inverts the data obtained during the read operation, the read and refresh operation will cycle the cell between the amorphous and crystalline states. In an embodiment, such cycling is performed in rapid succession to quickly cycle an array of phase-change memory cells. In a specific embodiment, extra circuitry is included to specify the number of cycles to run and the write-back element is enhanced to ensure that the phase-change memory cell does toggle between the correct state each cycle, raising an error flag if the cell fails to toggle at any iteration during the cycling.

Figure 5:
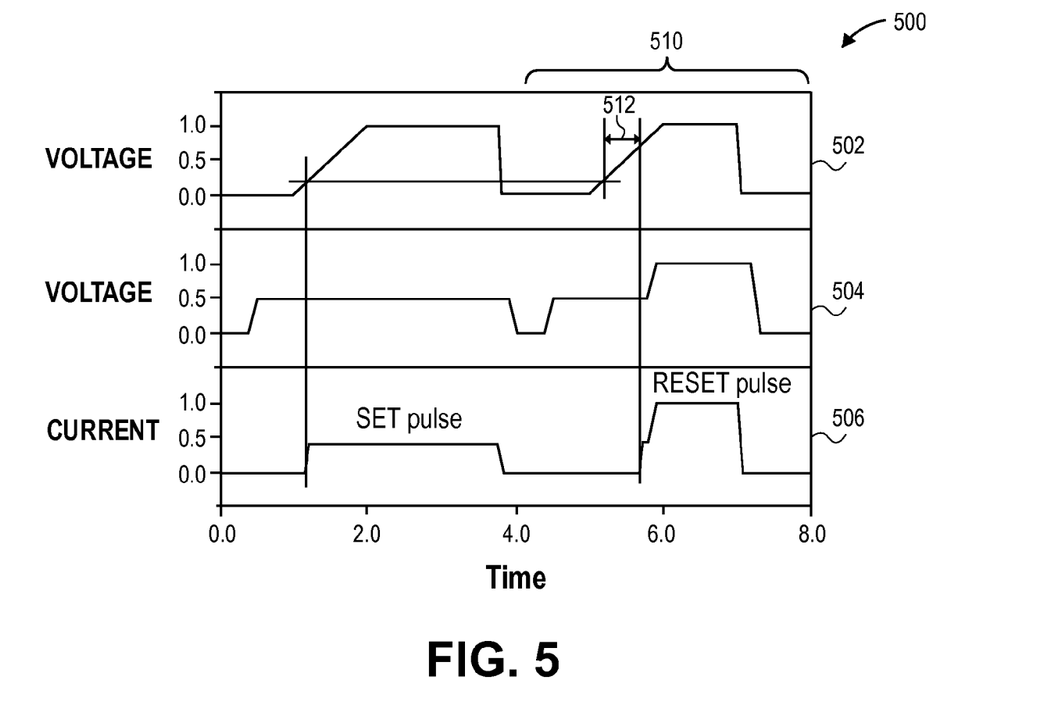
FIG. 5 illustrates a plot of waveforms corresponding to the operation of a circuit for refreshing or toggling a phase-change memory cell, in accordance with an embodiment of the present invention.

In an aspect of the present invention, the above described refreshing or toggling operations can be represented by waveforms. For example, FIG. 5 illustrates a plot 500 of waveforms corresponding to the operation of a circuit for refreshing or toggling a phase-change memory cell, in accordance with an embodiment of the present invention. Referring to FIG. 5, all axes (both x and y) are in arbitrary units. In an embodiment, the gate of the second transistor 214 of circuit 200 is first raised to a low value that will allow a moderate, crystallizing current to flow, as depicted in y-axis 504 of plot 500. Subsequently, a voltage ramp is applied to the gate of the first transistor 212 of circuit 200, as depicted in y-axis 502 of plot 500. In one embodiment, a crystallized phase-change memory cell begins to conduct shortly after the ramp begins, after which point the bottom transistor limits the current to that which re-crystallizes the phase-change memory cell, as depicted in y-axis 506 of plot 500. The write-back control determines that the phase-change memory cell was in the crystallized state and continues the current for a long enough time to ensure re-crystallization. The latter portion 510 of the waveforms of plot 500 indicates the result for an amorphous cell, which does not conduct until near the end of the voltage ramp, in accordance with an embodiment of the present invention. Subsequent to the point when the write-back control determines that the cell was in the amorphous state, second transistor 212 is enabled to flow high magnitude, amorphizing current, which can end earlier than the crystallizing pulse. The double-headed arrow 512 indicates the timing margin available for the write-back circuit to determine the state of the cell, which can be increased by reducing the ramp rate.

Figure 6:
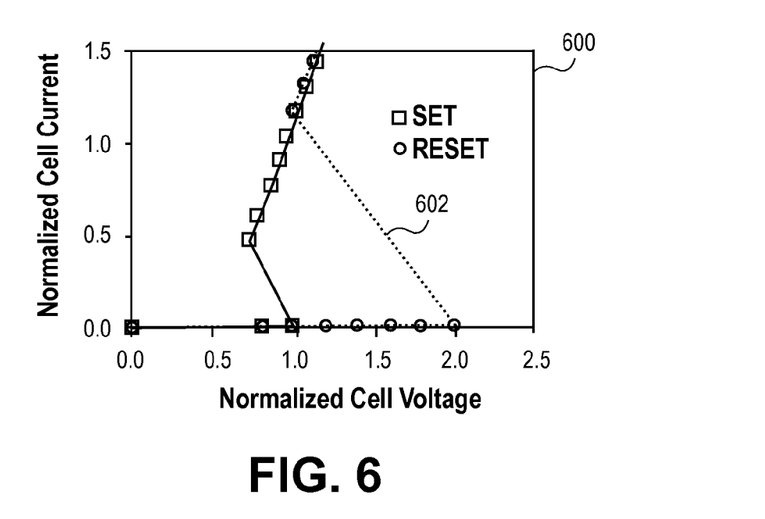
FIG. 6 illustrates a plot of a set of current-voltage curves for a phase-change memory cell that exhibits voltage threshold and snapback behavior in the crystalline state, in accordance with an embodiment of the present invention.

In another aspect of the present invention, a phase-change memory cell exhibits voltage threshold and snapback behavior even in the crystalline state. For example, FIG. 6 illustrates a plot 600 of a set of current-voltage curves for a phase-change memory cell that exhibits voltage threshold and snapback behavior in the crystalline state, in accordance with an embodiment of the present invention. Referring to FIG. 6, snap-back behavior 602 is exhibited for a phase-change memory cell in reset state upon reaching a normalized cell voltage of approximately 2 normalized Volts. In one embodiment, a circuit such as circuit 200 from FIG. 2 is implemented to read a phase-change memory cell state based on the voltage threshold for either the amorphous or the crystalline state, and to provide the information to a write-back circuit element. In a specific embodiment, the particular arrangement of the circuit enables configuration of a phase-change memory cell that is read and written-back in a short amount of time. By contrast, a conventional phase-change memory cell circuit reads the state of the phase-change memory cell using a low-field resistance followed by the issuing a separate write pulse. The conventional approach may incur overhead necessary to change from read to write mode. Instead, in accordance with an embodiment of the present invention, both the read and write operations are combined into a single operation and, accordingly, a phase-change memory cell enters the conductive state only once. In an embodiment, such an arrangement enables the use of a material that has otherwise poor retention characteristics. For example, in one embodiment, similar to DRAM, if power can be maintained, periodic refresh operations can be utilized to maintain the state of all phase-change memory cells. Also, in an embodiment, with the capability for built-in self-cycling, as described above, the amount of costly tester time required to ensure the quality and reliability of phase-change memory cells is reduced.

Figure 7:
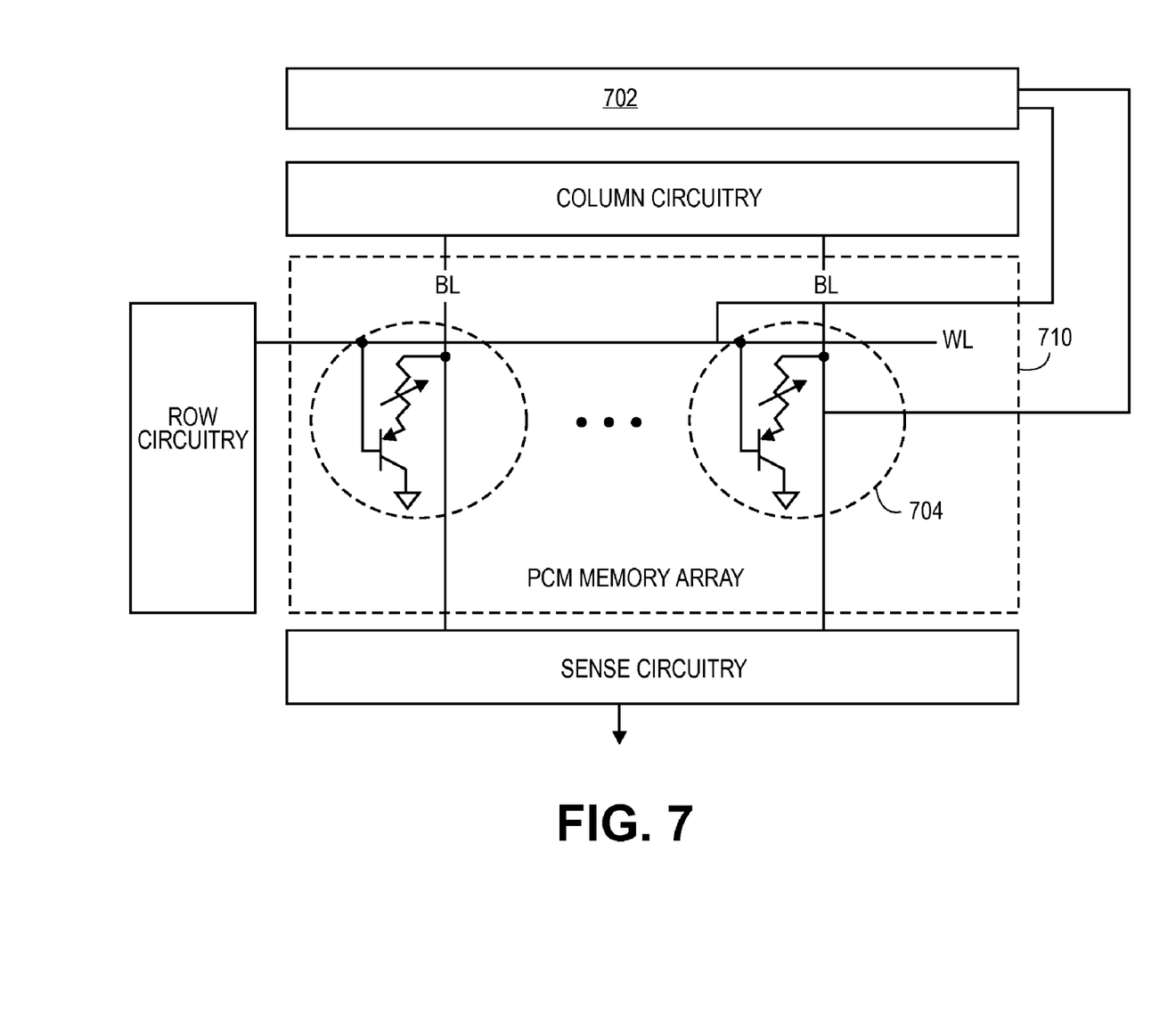
FIG. 7 illustrates an array of phase-change memory cells with at least one phase-change memory cell coupled to a circuit for refreshing or toggling the phase-change memory cell, in accordance with an embodiment of the present invention.

In an aspect of the present invention, a phase-change memory cell array includes memory cells that are composed of a storage material in combination with a selector device. For example, FIG. 7 illustrates an array 710 of phase-change memory cells, in accordance with an embodiment of the present invention. In an embodiment, array 710 includes phase-change memory cells composed of alloys of elements of group VI of the periodic table, elements such as Te or Se that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. Array 710 includes phase-change memory cells each having a selector device and a memory element. Although the array is illustrated with bipolar selector devices, it should be noted that alternative embodiments may use CMOS selector devices or diodes to identify and selectively change the electrical properties (e.g. resistance, capacitance, etc.) of the chalcogenide material through the application of energy such as, for example, heat, light, voltage potential, or electrical current. The chalcogenic material may be electrically switched between different states intermediate between the amorphous and the crystalline states, thereby giving rise to a multilevel storing capability. To alter the state or phase of the memory material, this embodiment illustrates a programming voltage potential that is greater than the threshold voltage of the memory select device that may be applied to the memory cell. An electrical current flows through the memory material and generates heat that changes the electrical characteristic and alters the memory state or phase of the memory material.

By way of example, heating the phase-change material to a temperature above 900° C. in a write operation places the phase change material above its melting temperature ($T_M$). Then, a rapid cooling places the phase-change material in the amorphous state that is referred to as a reset state where stored data may have a "1" value. Taking $Ge_2Sb_2Te_5$ as an example, the time between achieving the melting temperature Tm and quenching after the local heating to achieve the amorphous phase may be less than 50 nanoseconds. On the other hand, to program a memory cell from reset to set, the local temperature is raised higher than the crystallization temperature (Tx) for a time longer than 50 nanoseconds (for $Ge_2Sb_2Te_5$) to allow complete crystallization. The phase-change material in the crystalline form is referred to as a set state and stored data may have a "0" value. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize. In a read operation, the bit line (BL) and word line (WL) are selected and an external current is provided to the selected memory cell. To read a chalcogenide memory device, the current difference resulting from the different device resistance is sensed. It is then determined whether data stored in the selected memory cell is a "1" or "0" based on a voltage change caused by a resistance of the phase-change material of the selected memory cell. It is to be appreciated that the association of reset and set with amorphous and crystalline states, respectively, is a convention and that at least an opposite convention may be adopted. In accordance with an embodiment of the present invention, a circuit 702 for refreshing or toggling a phase-change memory cell is coupled to at least one phase-change memory cell 704 in array 710.

Figure 8:
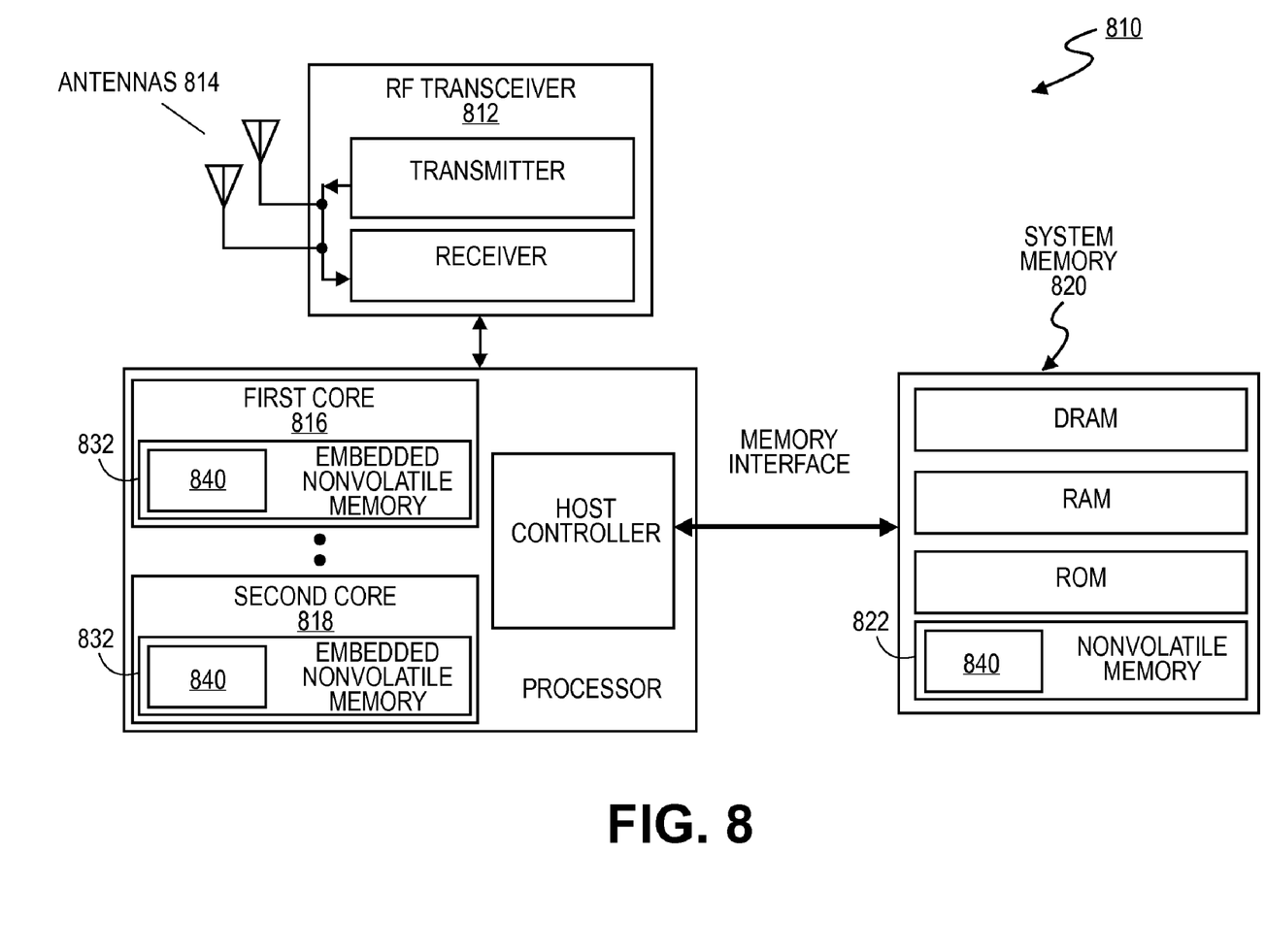
FIG. 8 illustrates a schematic representation of a wireless architecture that incorporates an array of phase-change memory cells with at least one phase-change memory cell coupled to a circuit for refreshing or toggling the phase-change memory cell, in accordance with an embodiment of the present invention.

In another aspect of the present invention, FIG. 8 illustrates a schematic representation of a wireless architecture that incorporates an array of phase-change memory cells with at least one phase-change memory cell coupled to a circuit for refreshing or toggling a phase-change memory cell, in accordance with an embodiment of the present invention. The wireless architecture embodiment illustrated in FIG. 8 shows a communications device 810. It should be noted that the present invention is not limited to wireless communication embodiments and other, non-wireless applications may be used in conjunction with embodiments of the present invention. As shown in this wireless embodiment, communications device 810 includes one or more antenna structures 814 to allow radios to communicate with other over-the-air communication devices. As such, communications device 810 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems co-located in the same platform of communications device 810 provide the capability of communicating with different frequency bands in an RF/location space with other devices in a network.

It should be understood that the scope of the present invention is not limited by the types of, the number of, or the frequency of the communication protocols that may be used by communications device 810. However, by way of example, the embodiment illustrates the coupling of antenna structure 814 to a transceiver 812 to accommodate modulation/demodulation. In general, analog front end transceiver 812 may be a stand-alone Radio Frequency (RF) discrete or integrated analog circuit, or transceiver 812 may be embedded with a processor having one or more processor cores 816 and 818. The multiple cores allow processing workloads to be shared across the cores and handle baseband functions and application functions. An interface may be used to provide communication or information between the processor and the memory storage in a system memory 820. Although the scope of the present invention is not limited in this respect, the interface may include serial and/or parallel buses to share information along with control signal lines to be used to provide handshaking between the processor and system memory 820.

The system memory 820 may optionally be used to store instructions that are executed by the processor during the operation of wireless communication device 810, and may be used to store user data such as the conditions for when a message is to be transmitted by wireless communication device 810 or the actual data to be transmitted. For example, the instructions stored in system memory 820 may be used to perform wireless communications, provide security functionality for communication device 810, user functionality such as calendaring, email, internet browsing, etc. System memory 820 may be provided by one or more different types of memory and may include both volatile and a nonvolatile memory 822 having a phase change material. Nonvolatile memory 822 may be referred to as a Phase Change Memory (PCM), Phase-Change Random Access Memory (PRAM or PCRAM), Ovonic Unified Memory (OUM) or Chalcogenide Random Access Memory (C-RAM).

The volatile and nonvolatile memories may be combined in a stacking process to reduce the footprint on a board, packaged separately, or placed in a multi-chip package with the memory component placed on top of the processor. The embodiment also illustrates that one or more of the processor cores may be embedded with nonvolatile memory 832. In accordance with an embodiment of the present invention, at least one phase-change memory cell in nonvolatile memory 822 or 832 is coupled to a circuit 840 for refreshing or toggling the phase-change memory cell, as depicted in FIG. 8.

Thus, an apparatus and a method for refreshing or toggling a phase-change memory cell have been disclosed. In accordance with an embodiment of the present invention, an apparatus includes a voltage ramp element coupled to the phase-change memory cell and provided for controlling voltage across the phase-change memory cell. A current control element is coupled to the phase-change memory cell and provided for controlling current through the phase-change memory cell. A current sensor element is coupled to the phase-change memory cell. A write-back timer and control element is coupled to the current sensor element and to the current control element. In one embodiment, the write-back timer and control element is provided for correcting, based on an output from the current sensor element, a drift in the phase-change memory cell. In another embodiment, the write-back timer and control element is provided for correcting for, based on an output from the current sensor element, a loss of retention or a degradation of data integrity in the phase-change memory cell.

What is claimed is:

1. A circuit for refreshing or toggling a phase-change memory cell, the circuit comprising:
   a voltage ramp element coupled to the phase-change memory cell and provided for controlling voltage across the phase-change memory cell;
   a current control element coupled to the phase-change memory cell and provided for controlling current through the phase-change memory cell;
   a current sensor element coupled to the phase-change memory cell; and
   a write-back timer and control element coupled to the current sensor element, to the current control element, and to the voltage ramp element.

2. The circuit of claim 1, wherein the voltage ramp element comprises a first transistor, and wherein the current sensor element is coupled to the phase-change memory cell by an output of the first transistor.

3. The circuit of claim 2, wherein the current control element comprises a second transistor, and wherein the current control element is configured to prevent current flow through the phase-change memory cell from exceeding a limit set by the gate voltage of the second transistor while a gate voltage applied to the first transistor is ramped to gradually increase the gate voltage over a period of time.

4. The circuit of claim 2, wherein the current control element comprises a second transistor, wherein the current control element is coupled to the phase-change memory cell by an output of the second transistor, and wherein an input of the second transistor is grounded.

5. The circuit of claim 1, wherein the current sensor element comprises a comparator circuit.

6. The circuit of claim 1, wherein the write-back timer and control element is provided for correcting, based on an output from the current sensor element, a drift in the phase-change memory cell.

7. The circuit of claim 1, wherein the write-back timer and control element is provided for correcting for, based on an output from the current sensor element, a loss of retention or a degradation of data integrity in the phase-change memory cell.

8. A method for refreshing a phase-change memory cell, comprising:
   determining if the phase-change memory cell is in a set state or a reset state, wherein the phase-change memory cell is coupled to a first transistor and a second transistor, and wherein the determining comprises preventing current flow through the phase-change memory cell from exceeding a limit set by the gate voltage of the second transistor while applying a gradually increasing gate voltage to the first transistor over a period of time; and
   delivering a current pulse to the phase-change memory cell either to maintain or to restore the set state or the reset state.

9. The method of claim 8, wherein the determining comprises obtaining a flag from a current sensor coupled to the phase-change memory cell.

10. The method of claim 9, wherein obtaining the flag comprises determining the timing of a current flow through the phase-change memory cell.

11. The method of claim 8, wherein preventing current flow through the phase-change memory cell from exceeding a limit set by the gate voltage of the second transistor comprises applying a fixed gate voltage to the second transistor, and wherein an input of the second transistor is grounded.

12. The method of claim 11, wherein restoring the set state or the reset state comprises, immediately following the determining, changing the gate voltage applied to the second transistor.

13. The method of claim 8, wherein maintaining or restoring the set state or the reset state comprises correcting a drift in the phase-change memory cell.

14. The method of claim 8, wherein maintaining or restoring the set state or the reset state comprises correcting for a loss of retention or a degradation of data integrity in the phase-change memory cell.

15. A method for cycling a phase-change memory cell, comprising:
   determining if the phase-change memory cell is in a set state or a reset state, wherein the phase-change memory cell is coupled to a first transistor and a second transistor, and wherein the determining comprises preventing current flow through the phase-change memory cell from exceeding a limit set by the gate voltage of the second transistor while applying a gradually increasing gate voltage to the first transistor over a period of time; and
   delivering a current pulse to the phase-change memory cell to toggle the set state or the reset state.

16. The method of claim 15, wherein the determining comprises obtaining a flag from a current sensor coupled to the phase-change memory cell.

17. The method of claim 16, wherein obtaining the flag comprises determining the timing of a current flow through the phase-change memory cell.

18. The method of claim 15, wherein preventing current flow through the phase-change memory cell from exceeding a limit set by the gate voltage of the second transistor comprises applying a fixed gate voltage to the second transistor, and wherein an input of the second transistor is grounded.

19. The method of claim 18, wherein toggling the set state or the reset state comprises, immediately following the determining, changing the gate voltage applied to the second transistor.

20. The method of claim 15, further comprising:
   repeating the toggling of the set state or the reset state to stress test the phase-change memory cell.

* * * * *